United States Patent [19]
Nishi

[11] Patent Number: 5,321,663
[45] Date of Patent: Jun. 14, 1994

[54] MEMORY CARD AND METHOD AND APPARATUS FOR CHECKING BACKUP VOLTAGE OF MEMORY CARD

[75] Inventor: Seiki Nishi, Tokyo, Japan

[73] Assignee: Fuji Photo Film Co., Ltd., Kanagawa, Japan

[21] Appl. No.: 838,828

[22] Filed: Feb. 21, 1992

[30] Foreign Application Priority Data

Feb. 25, 1991 [JP] Japan ................................... 3-53870

[51] Int. Cl.$^5$ ............................................. G11C 13/00
[52] U.S. Cl. ................................... 365/229; 365/228; 365/189.03
[58] Field of Search ..................... 365/189.03, 228, 229

[56] References Cited

U.S. PATENT DOCUMENTS

| | | | |
|---|---|---|---|
| 4,654,829 | 3/1987 | Jiang et al. | 365/189.03 |
| 4,662,736 | 5/1987 | Taniguchi et al. | 365/229 |
| 4,908,790 | 3/1990 | Little et al. | 365/229 |
| 4,985,870 | 1/1991 | Faraci | 365/229 |
| 5,007,027 | 4/1991 | Shimoi | 365/229 |

Primary Examiner—Eugene R. LaRoche
Assistant Examiner—Son Dinh

[57] ABSTRACT

A memory card is provided having a memory, in which data entered through a plurality of data input-output terminals are written. The voltage of a backup battery for supplying the memory to preserve the data therein is compared with two different reference voltages so as to detect two binary battery check signals. When the memory card is loaded in an electronic device, one of the two battery check signals is outputted to the electronic device through one of the data input-output terminals, while the other battery check signal is outputted through a battery check terminal. Alternatively, both of the battery check signals are outputted through two of the data input-output terminals. The electronic device displays a condition of the backup battery by energizing green, yellow or red LEDs to emit light, in accordance with the battery check signals.

16 Claims, 4 Drawing Sheets

MEMORY CARD AND METHOD AND APPARATUS FOR CHECKING BACKUP VOLTAGE OF MEMORY CARD

BACKGROUND OF THE INVENTION

1. Field of the Invention

The present invention relates to a memory card, and more particularly to a method and apparatus for checking a backup voltage necessary for reserving data in the memory card.

2. Related Art

Memory cards have been well known which each have a general purpose memory such as SRAM, EEPROM, ROM, and the like. The memory cards are used as external memories for electronic instruments, personal computers, metering devices, and so forth, or as recording mediums for electronic still cameras. If a RAM is used in the memory card, it is necessary to continuously supply the RAM with a predetermined voltage so as to preserve data written in the RAM. Therefore, the memory card is mounted with a backup battery for supplying the RAM. A lithium battery or another kind of battery which lasts for a relatively long time is typically used as the backup battery.

In this type of a memory card, if the backup battery is consumed, the data written in the RAM will vanish. Therefore, it is necessary check the condition of the backup battery and to replace the backup battery with a new one, before the back up battery in consumed. In checking the voltage of the backup battery of the memory card, it is determined whether the voltage is above or below a predetermined reference voltage in a battery check section of an electronic device to which the memory card is connected. Such an electronic device is hereinafter referred to as an external device. However, the conventional battery check system using only one reference level has the following problems.

If the reference voltage is set at a high level for safety, the backup battery may be changed even through the backup battery still has a sufficient charge amount to preserve the data for a relatively short time. This is apparently uneconomical and wasteful of the battery. On the contrary, if the reference voltage is set at a lower level, the user is required to prepare a spare backup battery for enabling a quick change of the backup battery at any time.

In order to solve the above-described problem, it is desirable to check the voltage V of the backup battery in two steps. Namely, the voltage V should be compared with two different levels of voltages V1 and V2 (V1>V2). When V>V1, the backup battery is determined to be sufficient. When V1≧V>V2, the backup battery is determined to be critical. When V≦V2, the backup battery is determined to be consumed.

Although at least two connector terminals are necessary for sending check signals of the battery voltage to a battery check section of an associated external device for checking the battery voltage in two steps, only one connector terminal is allocated to battery checking in memory cards having a specific function allocated to each individual connector terminal. Such memory card is, referred to, for example, in JEIDA's "IC Memory Card Guide Line" Ver. 3 JEIDA: Japan Electronic Industry Development Association) as an I/0 Bus-type memory card, which has an interface connector with 20 terminals, as shown in FIG. 2. In this memory card, one terminal Vbat is allocated for battery checking.

OBJECT OF THE INVENTION

It is, therefore, an object of the present invention to provide a memory card wherein a limited number of connector terminals are efficiently utilized.

Another object of the present invention is to provide a memory card wherein the backup voltage is compared with at least two different reference voltages and the results of this comparison are supplied as battery check data to an external device through two connector terminals, without the need for increasing the number of connector terminals, even if only one connector terminal of the memory is allocated for battery checking.

SUMMARY OF THE INVENTION

To achieve the above and other objects, a memory card of the present invention having a memory for storing data entered through a group of data input-output terminals is provided with first and second comparing sections for comparing the voltage of a backup battery with the first and second reference voltages, which are different from each other, so as to detect first and second check signals, respectively. The memory card includes a control circuit for controlling data communication between the memory card and an associated external device through the data input-output terminals. When the memory card has an output terminal which is specific to outputting the first check signal to an external device, the control circuit outputs the first check signal to the external device through one of the data input-output terminals. In this way, it becomes possible to output the two check signals without increasing the number of connection terminals.

It is also possible to output the first as well as second check signals through the data input-output terminals. In this way, it becomes possible to utilize a connector terminal, which is otherwise used to output a backup voltage check signal, for another supplemental function.

It is desirable to provide the associated external device with a display system for displaying the conditions of the backup battery, that the battery should be changed within a relatively long time or a short time, depending on the first and second check signals.

BRIEF DESCRIPTION OF THE DRAWINGS

The above and other objects and advantages will become apparent from the following detailed description of the preferred embodiments when read in conjunction with the accompanying drawings, wherein.

DETAILED DESCRIPTION OF THE PREFERRED EMBODIMENTS

Figure 1:
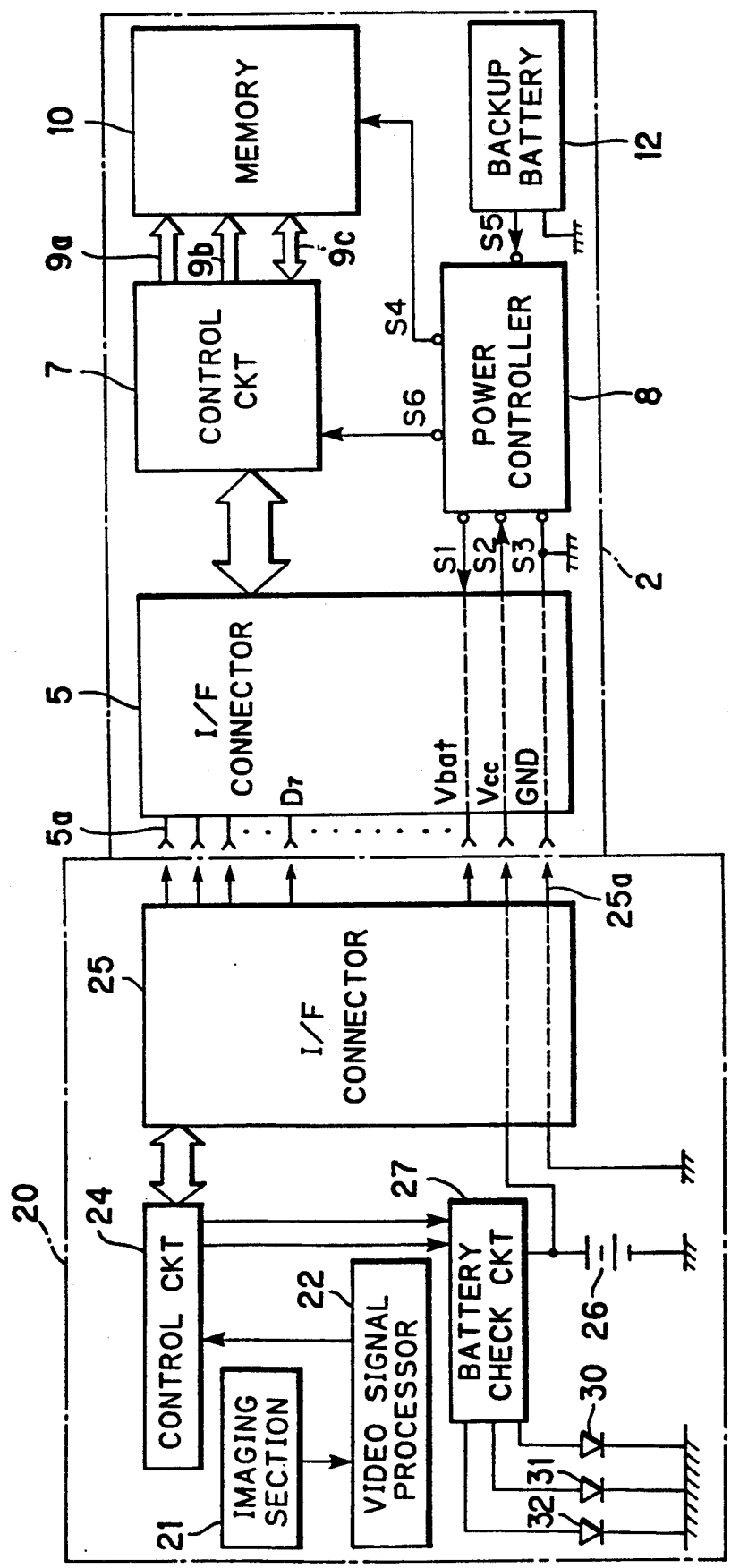
FIG. 1 is a block diagram showing the circuitry of a memory card for the embodiment of the present invention and an electronic still camera associated with the memory card.
Figure 2:
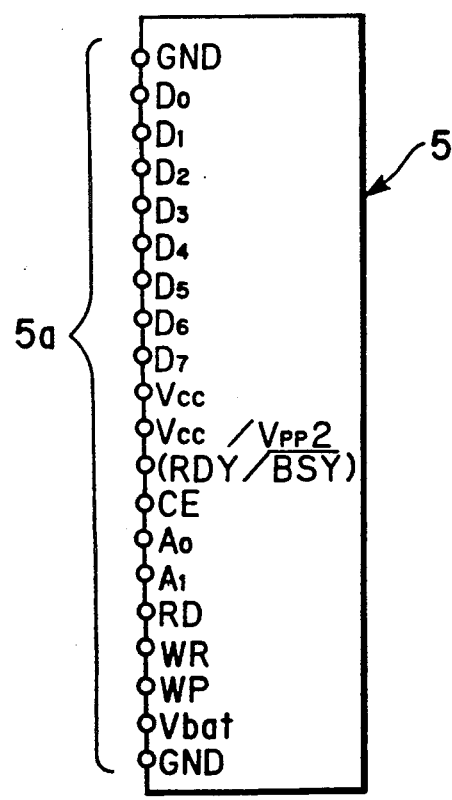
FIG. 2 schematically shows an interface connector of the memory card.

Referring to FIG. 1, a memory card 2 has an interface connector 5 including an I/0 interface and 20 terminals 5a. As shown in FIG. 2, the connector terminals 5a include ground terminals "GND", a power terminal "Vcc", 8-bits of data input-output terminals "D0–D7", control terminals "A0–A1", a read terminal "RD", a write terminal "WR", a write protect terminal "WP", a battery check terminal "Vbat" for outputting data indicative of whether the voltage of a backup battery of the memory card 2 is less than a first reference voltage V1, and so forth. Of these terminals 5a, the battery check terminal Vbat, the power terminal Vcc, and the ground terminals GND are connected to first, second and third terminals S1 to S3 of a power controller 8, respectively. The data input-output terminals D0–D7, the control terminals A0 and A1, read terminal RD, the write terminal WR and other terminals are connected to a control circuit 7 through a bus line. The control circuit 7 controls data input and output, and is connected to a memory 10 through a control line 9a, an address line 9b and a data line 9c for writing and reading data into and from the memory 10.

Figure 3:
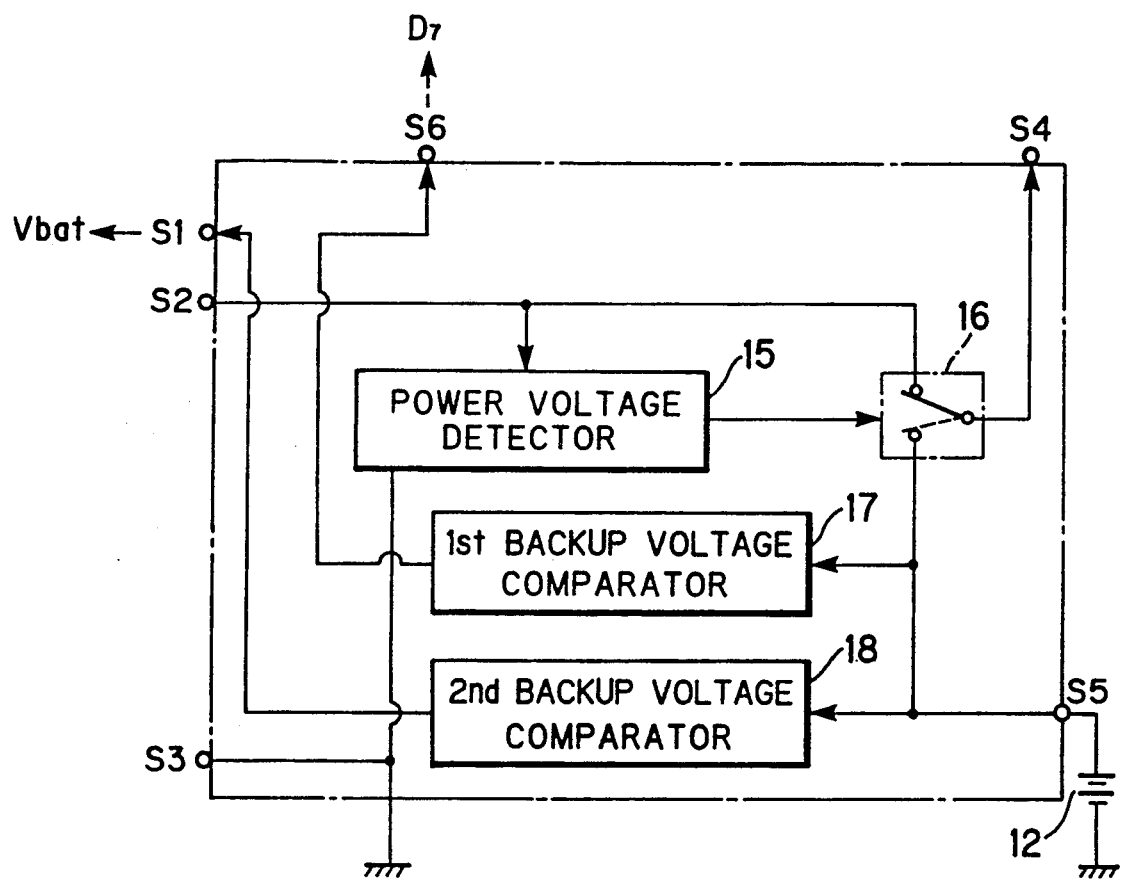
FIG. 3 is a block diagram showing the circuitry of the power controller of the memory card.

In order to preserve data written in the memory 10, it is necessary to apply at least a predetermined level of backup voltage, e.g. about 2V. For this purpose, a backup battery 12 is mounted in the memory card 2. It is to be noted that a voltage higher than the backup voltage, e.g. about 5V should be applied to the memory 10 so as to write data therein. The higher voltage is applied by an external device to the power controller 8 through the power terminal Vcc of the connector 5. The power controller 8, which controls power supply to the memory 10, is configured as shown in FIG. 3.

The voltage applied at the power terminal Vcc is applied to the power controller 8 through the second terminal S2. Upon detection of the voltage applied at the second terminal S2, a power voltage detector 15 switches over a switch 16 to a position shown by a solid line. Then, the memory 10 is supplied with the voltage from the external device. So long as no voltage is applied at the second terminal S2, the switch 16 is changed over to another position shown by a dotted line, so that the memory 10 is supplied by the backup battery 12 connected to a fifth terminal S5. It is to be noted that the third terminal S3 is also connected to the negative pole of the backup battery 12.

Figure 4:
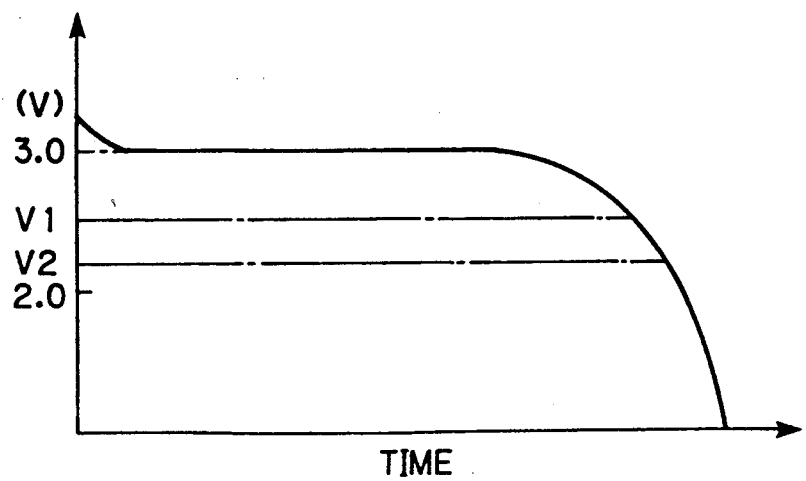
FIG. 4 is a graph showing a discharge curve of the backup battery.

The backup battery 12 is, for example, a coin-shaped lithium battery rated at 3V. The discharge curve of the backup battery is shown in FIG. 4. First and second backup voltage comparators 17 and 18 compare the momentary voltage of the backup battery 12 with the first reference voltage V1 and a second reference voltage V2 for outputting first and second check signals, respectively. The first check signal is at a high level (H) when the backup voltage is equal to or more than the first reference voltage V1, and at a low level (L) when the backup voltage is less than the voltage V1. The second check signal is at a high level (H) when the backup voltage is equal to or more than the second reference voltage V2, and at a low level (L) when the backup voltage is less than the voltage V2. The first check signal is sent to the control circuit 7 through a sixth terminal S6. The control circuit 7 outputs the first check signal to an external device through one of the data input-output terminals D1–D7, for instance the terminal D7, while the second check signal is sent to the external device through the first terminal S1 and the battery check terminal Vbat.

The first reference voltage V1 is higher than the second reference voltage V2 as shown in FIG. 4, and both reference voltages V1 and V2 are higher than the voltage necessary for preserving data in the memory 10, for instance, 2V. The first reference voltage V1 is set at such a level that the backup battery 12 will be discharged from this level V1 to "2V" in a relatively long time, e.g. several weeks. The reference voltage V2 is set at such a level that the backup battery 12 will be discharged from this level V2 to "2V" in a shorter time, e.g. several days. Accordingly, the backup battery 12 should be replaced by a new one if the backup voltage is determined to be lower than the second reference voltage V2.

The memory card 12 of this embodiment is used as an external recording medium for an electronic still camera 20, as shown in FIG. 1. The electronic still camera 20 includes an imaging section 21 including of an optical system, a solid state image sensor and so forth for detecting opt-electronic image signal, and a video signal processor 22 for converting the opt-electronic signal into an NTSC video signal. The video signal from the video signal processor 22 is, after converted into a digital signal by a control circuit 24, sent to the memory card 2 through an interface connector 25. The interface connector 25 includes an I/0 interface and a group of terminals 25a. that may be connected to the terminals 5a of the memory card 2. The electronic still camera 20 has a power source battery 26 therein, which supplies the respective circuit block of the electronic still camera 20. The battery 26 also supplies the memory card 2 through the power terminal Vcc when writing to the memory 10.

The battery check circuit 27 determines whether the voltage of the power source battery 26 is more than a predetermined level. The battery check circuit 27 also checks the condition of the backup battery 2, of the memory card 12, on the basis of the second check signal output from the battery check terminal Vbat and the first check signal output from the data terminal D7 which is ordinarily used for data communication between the camera 20 and the memory card 2. Green, yellow and red LEDs 30, 31 and 32 are provided to indicate the result of the battery checking.

The battery check operation of the memory card 2 and the electronic still camera 20 will now be described.

When the memory card 2 is connected to the electronic still camera 20 through the interface connectors 5 and 25, the voltage of the power source battery 26 of the camera 20 is applied to the terminal S2 of the power control circuit 8 through the power terminal Vcc by turning a power switch of the electronic still camera on. The power voltage detector 15 changes over the switch 16 to the position shown by the solid line upon detection of the voltage from the power source battery 26 which enables data to be written in the memory 10.

Figure 5:
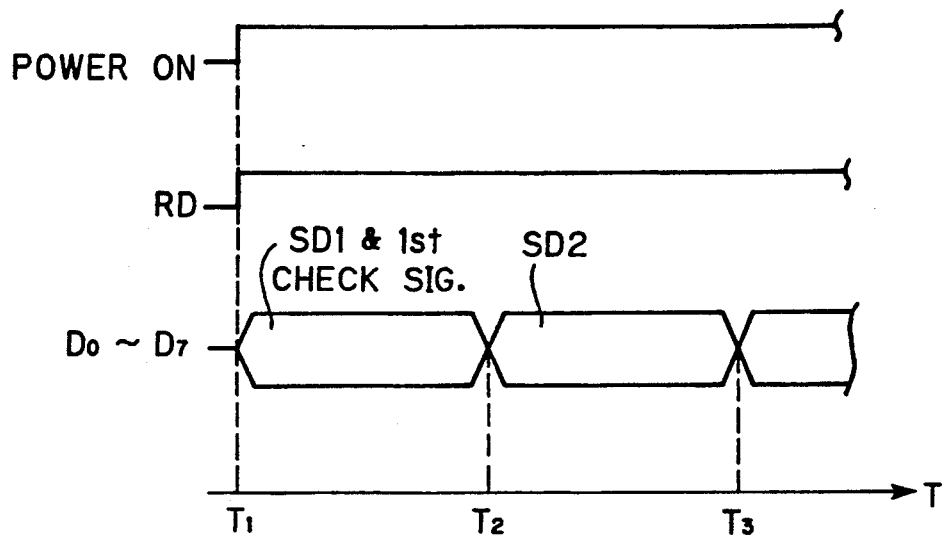
FIG. 5 is a time chart of the data read process from the memory card.

As shown in FIG. 5, when the power switch of the electronic still camera 20 is turned on at a time T1, the control circuit 24 of the camera 20 outputs a H signal to the read terminal RD of the memory card 2 for setting the memory card 2 to a read mode. In the read mode, the camera 20 outputs a binary signal "0, 0" as a control signal to control terminals A0 and A1 of the memory card 2. Then, the control circuit 7 of the memory card 2 outputs card type data SD1 to the camera 20 through the data terminals D0–D3, during a period from T1 to T2 in FIG. 5. The card type data SD1 indicates the type of memory 10. For example, the data terminal D0 is assigned to output data indicative of whether the memory 10 includes a RAM, the data terminal D1 indicates whether the memory 10 includes a Mask ROM, the terminal D2 indicates whether the memory 10 includes a PROM, the data terminal D3 indicates whether the memory 10 includes a EEPROM. Other data terminals D4–D7 are not used to output the card type data.

Simultaneously, the voltage of the backup battery 12 is compared with the reference voltages V1 and V2 in the backup voltage comparators 17 and 18. The first battery check signal from the first comparator 17 is sent to the control circuit 7 through the terminal S6, whereas the second battery check signal from the second comparator 18 is output to the electronic still camera 20 through the terminal S1 and the battery check terminal Vbat. Because the data terminals D4–D7 are not used during the period T1–T2, the control circuit 7 controls the output of the first battery check signal to the camera 20 through the data terminal D7 during this period.

The control circuit 24 of the camera 20 discriminates the type of the memory 10 based on the card type data SD1, so as to set the camera 20 at a corresponding read-write control mode. It is possible to display the type of the memory card 2. The control circuit 24 also send the first and second battery check signals to the battery check circuit 27.

The battery check circuit 27 firstly determines whether the power battery 26 in the electronic still camera 20 is consumed. If the voltage of the power battery 26 is less than a predetermined level, the battery check circuit 27 causes the red LED 32 to emit. If the voltage of the power battery 26 is not less than the predetermined level, then it is determined whether the voltage of the backup battery 12 of the memory card 2 is sufficient for preserving video data in the memory 10. If the backup battery 12 is new and hence the voltage thereof is equal to or more than the reference voltage V1, the battery check signals from the first and second backup voltage comparators 17 and 18 are at the H level, so that the battery check circuit 27 causes the green LED 30 to emit. In this way, the operator can see that both the power battery 26 and the backup battery 12 have sufficient levels of voltage.

If the backup voltage is less than the reference level V1 but equal to or more than the reference level V2, the first check signal is at the H level, whereas the second check signal is at the L level. In this case, the battery check circuit 27 causes the yellow LED 31 to emit, so as to indicate that the voltage of the backup battery 12 is critical and will be consumed within several weeks. Then, the operator only has to replace the backup battery 12 with a new battery within several weeks. Namely, the operator does not need to prepare a spare battery as rapidly to replace the backup battery 12.

If the backup voltage is less than the reference voltage V2, both the first and second check signals are at the L level. Then, the battery check circuit 27 causes the red LED 32 to emit, thereby alarming that the video data written in the memory card 2 will vanish in several days. As a result, the operator must replace the battery 12 by a new battery soon as possible.

When the voltage of the power battery 26 and the voltage of the backup battery 12 are determined to be sufficient, the control circuit 24 outputs a binary signal "1, 0" as a control signal to the control terminals A0 and A1 of the memory card 2 at a timing T2 shown in FIG. 5. Then, the control circuit 7 of the memory card 2 outputs 8-bit memory capacity data SD2 through the data terminals D0–D7. The memory capacity data SD2 indicates the capacity of the memory 10 which is available for writing new video data. The control circuit 24 of the camera 20 reads the memory capacity data SD2 in a period of time from T2 and T3, and writes the data SD2 in a memory at a predetermined address of the camera 20. It may be possible to provide a liquid crystal display for displaying the number of frames recordable in the memory card in accordance with the memory capacity data SD2.

After the timing T3, appropriate control signals are sent to the control terminals A0 and A1, the write terminal WR or other terminals in accordance with the operation of the camera 20. On the other hand, the video data and address data indicative of writing position of the video data are stored in the memory 10.

When the memory card 2 is removed from the electronic still camera 20 after the termination of photographing, the power supply to the power terminal Vcc is terminated, and the power voltage detector 15 changes over the switch 16 to the position show by dotted line. Then, the memory 10 is supplied by the backup battery 12, so as to preserve the data written in the memory 10 without an external power supply.

Figure 6:
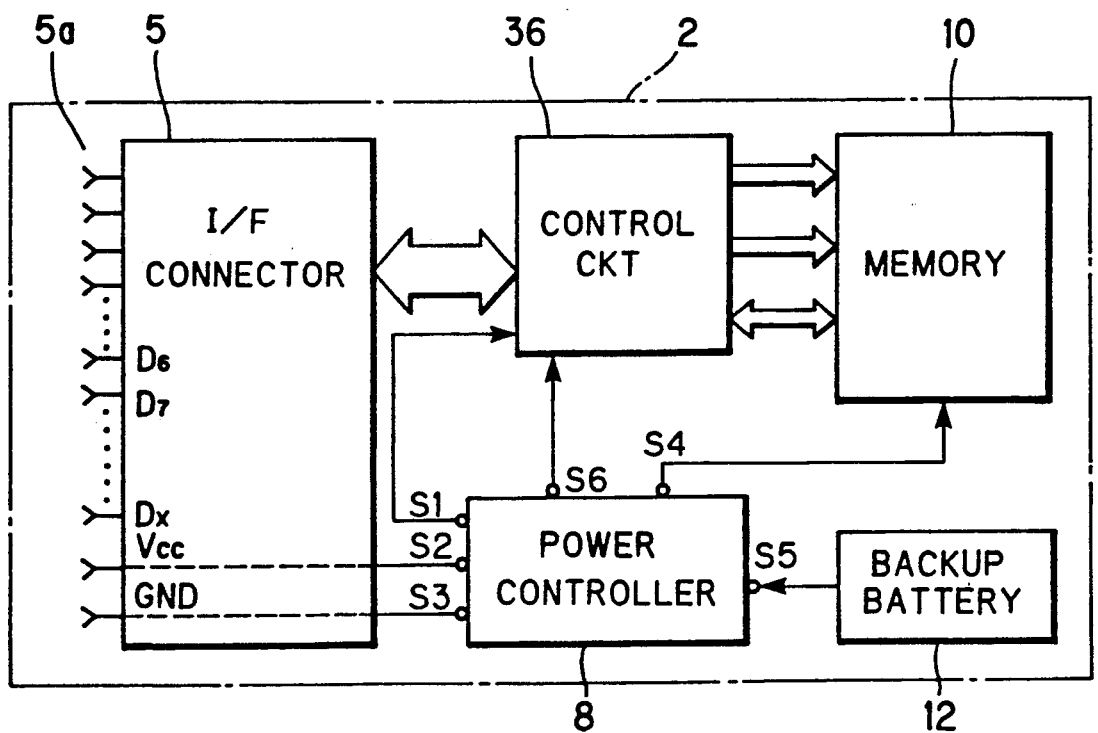
FIG. 6 is a block diagram showing a power controller according to another embodiment of the present invention.

FIG. 6 shows another embodiment of the present invention, wherein like or similar parts are designated by the same reference numerals used in FIG. 1. In this embodiment, the second check signal, which is output at the terminal S1 of the power controller 8, is sent to a control circuit 36 rather than the battery check terminal Vbat. The control circuit 36 controls the output of the first and second check signals through the data terminals D6 and D7 while outputting the above-described card type data SD1 through the data terminals D0–D3 in a period of time from T1 to T2 as shown in FIG. 5. According to this embodiment, because the terminals which would otherwise be used as a battery voltage check terminal Vbat, is an empty terminal Dx, it becomes possible to use this empty terminal Dx for another function. For example, this empty terminal Dx may be used as a further control terminal necessary for an upgraded version of the memory card. In this way, the memory card can have a supplemental function.

Although the present invention has been described in connection with the embodiments shown in the drawings, it will be understood that the present invention is not intended to be limited by the above described embodiment, but, on the contrary, various modifications of the present invention can be effected without departing from spirit and scope of the appended claims.

For example, the first check signal is not necessarily read out concurrently with the reading of the card type data SD1 from the memory card 2. Rather, the first check signal may be read out at another time only if at least one of the data terminals D0–D7 is not occupied at that time. It is possible to display the condition of the backup battery 12 and the power battery 20 on a liquid crystal display in place of the LEDs 30 to 32. It is also possible to compare the backup voltage with more than two reference voltages so as to check the backup battery 12 more elaborately, wherein the number of reference voltages depends on the number of unused data terminals D0–D7, that is, the bits of the data that should be sent concurrently with the battery check signals.

Needless to say, the memory card of the present invention may be adapted for use not only in audio or video recording devices, but also in any other device which has data processing functions.

What is claimed is:

1. A memory card comprising:
    an interface connector having a plurality of data input-output terminals comprising eight data input-output terminals;
    a memory for storing data entered through said data input-output terminals;
    a backup battery for supplying power to said memory so as to preserve the data stored therein;
    first comparing means for comparing a voltage of said backup battery with a first predetermined reference voltage so as to generate a first signal;
    second comparing means for comparing a voltage of said backup battery with a second predetermined reference voltage so as to generate a second signal, said second reference voltage being less than said first reference voltage; and
    control means for outputting said first and second signals through two of said data input-output terminals, said control means outputting said first and second signals through two terminals of said eight data input-output terminals when outputting 4-bits of card type data from said memory card through four of the remaining six data input-output terminals and before 8-bits of data are written in said memory.

2. A memory card as recited in claim 1, wherein said first reference voltage is less than a rated voltage of said backup battery, and said second reference voltage is more than a minimum voltage for enabling said memory to preserve the data stored therein.

3. An electronic device as recited in claim 2, wherein said first signal indicates that said backup battery will be consumed in several weeks, and said second signal indicates that said backup battery will be consumed in a shorter time than several weeks.

4. A memory card as recited in claim 2, wherein said control means outputs said first and second signals while data is output from said memory card through predetermined terminals of said plurality of data input-output terminals.

5. A memory card comprising:
    an interface connector having a plurality of data input-output terminals comprising eight data input-output terminals;
    a memory for storing data entered through said data input-output terminals;
    a backup battery for supplying power to said memory so as to preserve the data stored therein;
    first comparing means for comparing a voltage of said backup battery with a first predetermined reference voltage so as to generate a first signal, wherein said first predetermined reference voltage is less than a rated voltage of said backup battery;
    second comparing means for comparing a voltage of said backup battery with a second predetermined reference voltage so as to generate a second signal, said second predetermined reference voltage being less than said first predetermined reference voltage and said second predetermined reference voltage is more than a minimum voltage for enabling said memory to preserve the data stored therein;
    control means for outputting said first and second signals through two of said data input-output terminals, said control means outputs said first and second signals while data is output form said memory card through predetermined terminals of said plurality of data input-output terminals and outputs said first and second signals through two terminals of said eight data input-output terminals when outputting 4-bits of card type data from said memory card through four of the remaining six data input-output terminals and before 8-bits of data are written in said memory;
    a pair of power supply terminals for connecting to a power source of a device, said device and said memory card being adapted from connection to each other; and
    switching means for switching over said memory from said backup battery to said power source when said switching means detects that a predetermined power from said power source is applied to said pair of power supply terminals.

6. A memory card comprising:
    an interface connector having a plurality of data input-output terminals comprising eight data input-output terminals and a battery check terminal for outputting a first battery check signal;
    a memory for storing data entered through said plurality of data input-output terminals;
    a backup battery for supplying power to said memory so as to preserve the data stored therein;
    first comparing means for comparing a voltage of said backup battery with a first predetermined reference voltage so as to generate said first battery check signal;
    second comparing means for comparing a voltage of said backup battery with a second predetermined reference voltage so as to generate a second battery check signal, said second reference voltage having a different voltage than said first reference voltage; and
    control means for outputting said second battery check signal through one of said plurality of data input-output terminals, said control means outputs said second battery check signal through one terminal of said eight data input-output terminals when outputting 4-bits of card type data from said memory card through four of the remaining seven data input-output terminals and before 8-bits of data are written in said memory.

7. A memory card as recited in claim 6, wherein said first reference voltage is less than a rated voltage of said backup battery, and said second reference voltage is more than a minimum voltage for enabling said memory to preserve the data stored therein.

8. A memory card as recited in claim 7, wherein said first battery check signal indicates that said backup battery will be consumed in several weeks, and said second battery check signal indicates that said backup battery will be consumed in a shorter time than several weeks.

9. A memory card as recited in claim 7, wherein said control means outputs said second battery check signal while data is output from said memory card through predetermined terminals of said plurality of data input-output terminals.

10. A memory card comprising:
    an interface connector having a plurality of data input-output terminals comprising eight data input-output terminals and a battery check terminal for outputting a first battery check signal;

a memory for storing data entered through said plurality of data input-output terminals;

a backup battery for supplying power to said memory so as to preserve the data stored therein;

first comparing means for comparing a voltage of said backup battery with a first predetermined reference voltage so as to generate said first battery check signal, wherein said first predetermined reference voltage is less than a rated voltage of said backup battery and said first battery check signal indicates that said backup battery will be consumed in several weeks;

second comparing means for comparing a voltage of said backup battery with a second predetermined reference voltage, so as to generate a second battery check signal, said second predetermined reference voltage having a different voltage than said first predetermined reference voltage and said second predetermined reference voltage is more than a minimum voltage for enabling said memory to preserve the data stored therein, wherein said second battery check signal indicates that said backup battery will be consumed in a shorter time than several weeks;

control means for outputting said second battery check signal through one of said plurality of data input-output terminals, said control means outputs said battery check signal while data is output from said memory card through predetermined terminals of said plurality of data input-output terminals and outputs said second battery check signal through one terminal of said eight data input-output terminals when outputting 4-bits of card type data from said memory card through four of the remaining seven data input-output terminals and before 8-bits of data are written in said memory.

a pair of power supply terminals for connecting to a power source of a device, said device and said memory card being adapted for connection to each other; and switching means for switching over said memory from said backup battery to said power source when said switching means detects that a predetermined power from said power source is applied to said pair of power supply terminals.

11. A method for checking a voltage of a backup battery of a memory card comprising the steps of:

comparing the voltage of said backup battery with a first predetermined reference voltage so as to generate a first battery check signal;

comparing the voltage of said backup battery with a second predetermined reference voltage so as to generate a second battery check signal, said second reference voltage having a different voltage level than said first reference voltage;

outputting said first battery check signal through a predetermined terminal of said memory card which is adapted to output said first battery check signal;

outputting said second battery check signal through one of a plurality of data input-output terminals while outputting card type data from said memory card through the remaining terminals of said plurality of data input-output terminals; and thereafter starting data communication through all of said plurality of data input-output terminals.

12. A method recited in claim 11, further comprising the step of displaying a condition of said backup battery in accordance with said first and second battery check signals.

13. A method as recited in claim 12, wherein said first and second reference voltages are less than a rated voltage of said backup battery but more than a minimum voltage for enabling said memory card to preserve data written therein through said plurality of data input-output terminals.

14. A method for checking a voltage of a backup battery of a memory card comprising the steps of:

comparing the voltage of said backup battery with a first predetermined reference voltage so as to generate a first battery check signal;

comparing the voltage of said backup battery with a second predetermined reference voltage so as to generate a second battery check signal, said second reference voltage being less than said first reference voltage;

outputting said first and second battery check signals through predetermined terminals of a plurality of data input-output terminals while outputting card type data from said memory card through the remaining terminals of said plurality of data input-output terminals; and thereafter starting data communication through all of said plurality of data input-output terminals.

15. A method recited in claim 14, further comprising the step of displaying a condition of said backup battery in accordance with said first and second battery check signals.

16. A method as recited in claim 15, wherein said first reference voltage is less than a rated voltage of said backup battery, and said second reference voltage is more than a minimum voltage for enabling said memory card to preserve data written therein through said plurality of data input-output terminals.

* * * * *